(12) United States Patent
Wu

(10) Patent No.: US 12,136,553 B2
(45) Date of Patent: Nov. 5, 2024

(54) OPENING STRUCTURE AND FORMING METHOD THEREOF, CONTACT PLUG STRUCTURE AND FORMING METHOD THEREOF

(71) Applicant: CHANGXIN MEMORY TECHNOLOGIES, INC., Hefei (CN)

(72) Inventor: Ping-Heng Wu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 374 days.

(21) Appl. No.: 17/578,509

(22) Filed: Jan. 19, 2022

(65) Prior Publication Data
US 2022/0139721 A1 May 5, 2022

Related U.S. Application Data

(63) Continuation of application No. PCT/CN2021/100699, filed on Jun. 17, 2021.

(30) Foreign Application Priority Data

Sep. 22, 2020 (CN) .......................... 202011000653.1

(51) Int. Cl.
*H01L 21/311* (2006.01)
*H01L 21/768* (2006.01)
*H01L 29/40* (2006.01)

(52) U.S. Cl.
CPC .. *H01L 21/31144* (2013.01); *H01L 21/76802* (2013.01); *H01L 21/76831* (2013.01); *H01L 29/401* (2013.01)

(58) Field of Classification Search
CPC ......... H01L 21/31144; H01L 21/76802; H01L 21/76831; H01L 21/76897;
(Continued)

(56) References Cited

U.S. PATENT DOCUMENTS

| 5,285,110 A | 2/1994 | Bae |
| 5,320,980 A | 6/1994 | Bae |

(Continued)

FOREIGN PATENT DOCUMENTS

| CN | 1467826 A | 1/2004 |
| CN | 1204606 C | 6/2005 |

(Continued)

OTHER PUBLICATIONS

Supplementary European Search Report in the European application No. 21773256.9, mailed on Apr. 12, 2022, 9 pgs.

(Continued)

*Primary Examiner* — Bac H Au
(74) *Attorney, Agent, or Firm* — Kilpatrick Townsend & Stockton LLP

(57) ABSTRACT

A forming method for an opening structure includes: a substrate is provided, where a target layer is formed in the substrate, and the substrate exposes a surface of the target layer; an annular gasket is formed on the surface of the target layer, where a central through hole exposing a part of the surface of the target layer is provided in a center of the annular gasket; a dielectric layer covering the substrate, the target layer and the annular gasket is formed; and the dielectric layer is etched to form an etching hole communicating with the central through hole in the dielectric layer, where the etching hole and the central through hole form an opening structure.

14 Claims, 15 Drawing Sheets

(58) Field of Classification Search
CPC ......... H01L 21/76816; H01L 21/76805; H01L 21/76877; H01L 23/481; H01L 29/401
See application file for complete search history.

(56) References Cited

U.S. PATENT DOCUMENTS

| | | | |
|---|---|---|---|
| 6,136,695 A | 10/2000 | Lee | |
| 6,812,577 B2 | 11/2004 | Lee | |
| 7,026,207 B2 | 4/2006 | Tsai | |
| 7,041,605 B2 | 5/2006 | Lee | |
| 7,259,087 B2 | 8/2007 | Jung | |
| 7,754,602 B2 * | 7/2010 | Jeon | H10B 41/30 438/618 |
| 7,829,410 B2 | 11/2010 | Plum | |
| 8,039,377 B2 | 10/2011 | Plum | |
| 8,299,574 B2 | 10/2012 | Plum | |
| 8,372,724 B2 | 2/2013 | Takaishi | |
| 8,395,235 B2 | 3/2013 | Tsuchiya | |
| 8,871,633 B2 | 10/2014 | Fukasawa | |
| 9,076,804 B2 | 7/2015 | Liao et al. | |
| 9,230,966 B2 | 1/2016 | Sapra et al. | |
| 9,263,392 B1 * | 2/2016 | Lin | H01L 21/31144 |
| 9,293,411 B2 | 3/2016 | Fukasawa | |
| 9,368,395 B1 * | 6/2016 | Wei | H01L 21/7682 |
| 9,425,142 B2 | 8/2016 | Fukasawa | |
| 9,627,359 B2 | 4/2017 | Fukasawa | |
| 9,859,214 B2 | 1/2018 | Fukasawa | |
| 9,871,052 B2 | 1/2018 | Lee | |
| 9,941,206 B2 | 4/2018 | Kang | |
| 9,978,677 B2 | 5/2018 | Liu | |
| 10,037,918 B2 | 7/2018 | Hsu et al. | |
| 10,157,837 B2 | 12/2018 | Fukasawa | |
| 10,504,839 B2 | 12/2019 | Fukasawa | |
| 10,622,305 B2 | 4/2020 | Kang | |
| 2004/0002189 A1 | 1/2004 | Park | |
| 2004/0046251 A1 | 3/2004 | Lee | |
| 2004/0197986 A1 | 10/2004 | Tsai | |
| 2004/0198008 A1 * | 10/2004 | Tsai | H01L 21/76895 257/E21.507 |
| 2004/0245650 A1 | 12/2004 | Lee | |
| 2005/0042878 A1 | 2/2005 | Jung | |
| 2009/0134491 A1 | 5/2009 | Plum | |
| 2010/0295110 A1 | 11/2010 | Takaishi | |
| 2011/0018098 A1 | 1/2011 | Plum | |
| 2011/0062552 A1 | 3/2011 | Tsuchiya | |
| 2012/0001299 A1 | 1/2012 | Plum | |
| 2013/0082401 A1 | 4/2013 | Fukasawa | |
| 2014/0210087 A1 | 7/2014 | Kang | |
| 2015/0008591 A1 | 1/2015 | Fukasawa | |
| 2015/0054163 A1 | 2/2015 | Liao et al. | |
| 2015/0294971 A1 | 10/2015 | Sapra et al. | |
| 2015/0357313 A1 | 12/2015 | Fukasawa | |
| 2016/0013191 A1 | 1/2016 | Sapra et al. | |
| 2016/0307877 A1 | 10/2016 | Fukasawa | |
| 2017/0110473 A1 | 4/2017 | Lee | |
| 2017/0117218 A1 | 4/2017 | Liu | |
| 2017/0207163 A1 | 7/2017 | Fukasawa | |
| 2018/0068899 A1 | 3/2018 | Tapily et al. | |
| 2018/0076126 A1 | 3/2018 | Fukasawa | |
| 2018/0090511 A1 | 3/2018 | Nakajima | |
| 2018/0151560 A1 | 5/2018 | Hsu et al. | |
| 2018/0197815 A1 | 7/2018 | Kang | |
| 2018/0294225 A1 | 10/2018 | Lee et al. | |
| 2019/0080997 A1 | 3/2019 | Fukasawa | |
| 2020/0006128 A1 * | 1/2020 | Weng | H01L 23/3171 |
| 2020/0020711 A1 | 1/2020 | Liao | |
| 2020/0027827 A1 | 1/2020 | Lin et al. | |
| 2022/0093509 A1 * | 3/2022 | Liu | H01L 23/5226 |
| 2022/0149148 A1 * | 5/2022 | Wu | H01L 28/60 |

FOREIGN PATENT DOCUMENTS

| | | |
|---|---|---|
| CN | 1956184 A | 5/2007 |
| CN | 101874303 A | 10/2010 |
| CN | 103094186 A | 5/2013 |
| CN | 103972158 A | 8/2014 |
| CN | 104347345 A | 2/2015 |
| CN | 104425567 A | 3/2015 |
| CN | 104658962 A | 5/2015 |
| CN | 104979163 A | 10/2015 |
| CN | 106611742 A | 5/2017 |
| CN | 108122845 A | 6/2018 |
| CN | 108695336 A | 10/2018 |
| CN | 109037214 A | 12/2018 |
| CN | 109273430 A | 1/2019 |
| CN | 211017076 U | 7/2020 |
| KR | 20050066369 A | 6/2005 |
| KR | 20080093738 A | 10/2008 |
| WO | 2018063337 A1 | 4/2018 |

OTHER PUBLICATIONS

International Search Report in the international application No. PCT/CN2021/099873, mailed on Aug. 4, 2021, 3 pgs.
International Search Report in the international application No. PCT/CN2021/100740, mailed on Sep. 15, 2021, 3 pgs.
International Search Report in the international application No. PCT/CN2021/099878, mailed on Sep. 13, 2021, 2 pgs.
International Search Report in the international application No. PCT/CN2021/100699, mailed on Aug. 31, 2021, 2 pgs.

* cited by examiner

OPENING STRUCTURE AND FORMING METHOD THEREOF, CONTACT PLUG STRUCTURE AND FORMING METHOD THEREOF

CROSS-REFERENCE TO RELATED APPLICATIONS

This application is a continuation application of International Patent Application No. PCT/CN2021/100699, filed on Jun. 17, 2021, which is based upon and claims priority to Chinese Patent Application No. 202011000653.1, filed on Sep. 22, 2020 and entitled "OPENING STRUCTURE AND FORMING METHOD THEREOF, CONTACT PLUG STRUCTURE AND FORMING METHOD THEREOF". The disclosures of International Patent Application No. PCT/CN2021/100699 and Chinese Patent Application No. 202011000653.1 are hereby incorporated by reference in their entireties.

TECHNICAL FIELD

The disclosure relates to the field of semiconductors, in particular to an opening structure and a forming method thereof, a contact plug structure and a forming method thereof.

BACKGROUND

With the development of an integrated circuit to a very large scale integrated circuit, the circuit density in the integrated circuit is becoming increasingly high, and the quantity of included components is increasingly large. With such development, the surface of a wafer cannot provide sufficient area to make required interconnecting wires.

In order to meet the demands of the interconnecting wires after the component size is reduced, the design of multilayer metal interconnecting wire with two or more layers has become a common method used in the very large scale integrated circuit technology. At present, the conduction between different metal layers or between the metal layer and a lining layer may be implemented through a contact plug structure. The existing forming process of the contact plug structure generally includes: a target metal layer is formed in a substrate, and the target metal layer is flush with the surface of the substrate; a dielectric layer is formed on the substrate and the target metal layer; an etching through hole (or a contact window) exposing the surface of the target metal layer is formed in the dielectric layer; and metal is filled in the etching through hole (or the contact window), so as to form the contact plug structure.

With the device integration being increasingly high, the depth-to-width ratio of the etching through hole formed in the dielectric layer is continuously improved, and formation of a through hole with a high aspect ratio is always a great challenge for an etching process. When the etching through hole with the high aspect ratio is formed, there are usually problems of through hole offset, poor contact and over etching of the hole.

SUMMARY

Embodiments of the disclosure provide a forming method for an opening structure, which includes the following operations. A substrate is provided, where a target layer is formed in the substrate, and the substrate exposes a surface of the target layer. An annular gasket is formed on the surface of the target layer, where a central through hole exposing a part of the surface of the target layer is provided in a center of the annular gasket. A dielectric layer covering the substrate, the target layer and the annular gasket are formed. The dielectric layer is etched to form an etching hole communicating with the central through hole in the dielectric layer, where the etching hole and the central through hole form the opening structure.

Embodiments of the disclosure further provide a forming method for a contact plug structure, and the method includes the following operations. An opening structure is formed by: providing a substrate, wherein a target layer is formed in the substrate, and the substrate exposes a surface of the target layer; forming an annular gasket on the surface of the target layer, wherein a central through hole exposing a part of the surface of the target layer is provided in a center of the annular gasket; forming a dielectric layer covering the substrate, the target layer and the annular gasket; and etching the dielectric layer to form an etching hole communicating with the central through hole in the dielectric layer, the etching hole and the central through hole forming the opening structure. The opening structure is used as a contact window structure. Conductive material is formed in the contact window structure, so as to form the contact plug structure.

Embodiments of the disclosure further provide an opening structure, which includes a substrate, an annular gasket, a dielectric layer and an etching hole. A target layer is formed in the substrate, and the substrate exposes a surface of the target layer. The annular gasket is located on the surface of the target layer, where the central through hole exposing a part of the surface of the target layer is provided in a center of the annular gasket. The dielectric layer covers the substrate, the target layer and the annular gasket. The etching hole communicates with the central through hole and is located in the dielectric layer.

DETAILED DESCRIPTION

As mentioned in the background, the through hole offset is a common problem when the etching through hole with a high aspect ratio is formed.

Figure 1:
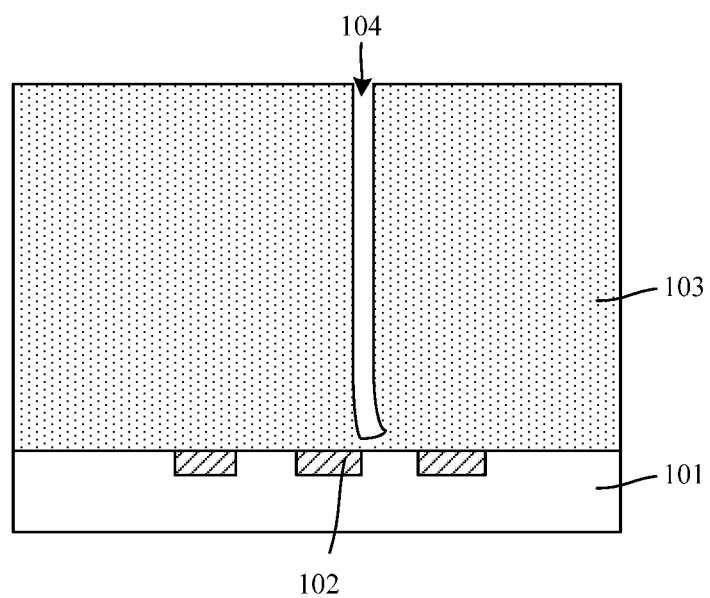
FIG. 1 is the structural schematic diagram of a currently formed through hole.

It has found through research that, referring to FIG. 1, the magnetic field at the edge of a wafer has weaker bias voltage, so the bending of the etching through hole 104 is easily caused, the bottom of the etching through hole will be deviated from the normal position, and the surface of the target metal layer cannot be normally exposed. Or, due to the deviation of an overlay process, the formed etching through hole is deviated from the normal position.

Therefore, the disclosure provides an opening structure and a forming method thereof, a contact plug structure and a forming method thereof. The forming method for an opening structure includes: a substrate is provided, a target layer is formed in the substrate, and the substrate exposes a surface of the target layer; an annular gasket is formed on the surface of the target layer, and a central through hole exposing the a part of the surface of the target layer is provided in a center of the annular gasket; a dielectric layer covering the substrate, the target layer and the annular gasket is formed; and the dielectric layer is etched to form an etching hole communicating with the central through hole in the dielectric layer, where the etching hole and the central through hole form an opening structure. By forming the annular gasket, when the etching hole is formed in the dielectric layer, and bending or position offset occurs to the etching hole, the annular gasket can prevent side etching at the bottom of the etching hole, so that the bottom of the etching hole is guided to the central through hole of the annular gasket. Therefore, the bottom of the etching hole is correctly guided to the correct position, the formed opening structure can normally expose the surface of the target metal layer; in addition, the existence of the annular gasket can prevent the anomaly, such as electrical leakage, caused by metal diffusion brought by the contact plug subsequently formed in the opening structure.

In order to make the abovementioned purposes, features and advantages of the disclosure more clear and understandable, the specific implementation mode of the disclosure will be clearly and completely described below in combination with the drawings. When describing the embodiments of the disclosure in details, for easy description, the schematic diagram is partially enlarged beyond the general proportion, and moreover, the schematic diagram is only an example, and the protection scope of the disclosure shall not be limited herein. In addition, the three-dimensional space size of the length, width and depth shall be included in actual manufacturing.

Figure 2:
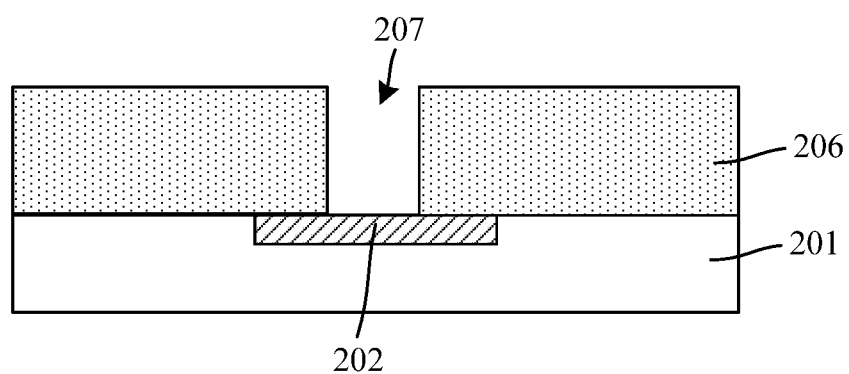
FIG. 2 to FIG. 14 are cross-sectional diagrams of a forming process for an opening structure according to embodiments of the disclosure.

Referring to FIG. 2, a substrate 201 is provided, a target layer 202 is formed in the substrate 201, and the substrate 201 exposes a surface of the target layer 202.

In one embodiment, the substrate 201 may be a semiconductor substrate, and the target layer 202 may be a doping area (for example, an area doped with N-type impurity ions or P-type impurity ion) located in the semiconductor substrate or a metal silicide area (for example, a nickel silicide area or a cobalt silicide area) located in the semiconductor substrate. The material of the semiconductor substrate may be Silicon (Si), Germanium (Ge), Silicon-Germanium (GeSi), Silicon Carbide (SiC), or Silicon On Insulator (SOI), Germanium On Insulator (GOI), or other materials, such as gallium arsenide and III-V compound.

In other embodiments, the substrate 201 may include a semiconductor substrate and an interlayer dielectric layer located in the semiconductor substrate, and the target layer 202 is located in the interlayer dielectric layer. The interlayer dielectric layer may be a single-layer or multi-layer piling structure, the target layer 202 may be a metal layer, and the metal layer may be connected to a conductive structure (for example, a conductive plug) formed in a lower-layer dielectric layer.

The surface of the target layer 202 may be flush with that of the substrate 201, or slightly higher than that of the substrate 102.

One or more target layers 202 (greater than or equal to two) may be formed in the substrate 201, when there are multiple target layers 202, the adjacent target layers are separate, and in this embodiment, only one target layer 202 in the substrate 201 is taken as an example for illustration.

The target layer 202 needs to form the annular gasket subsequently. In one embodiment, still referring to FIG. 2, the mask material layer 206 is formed on the substrate 201 and a part of the surface of the target layer 202, and the through hole 207 exposing the part of the surface of the target layer 202 is formed in the mask material layer 206.

The material of the mask material layer 206 may be any one or more of photoresist, silicon nitride, silicon oxide, silicon carbon nitride, silicon oxynitride, polycrystalline silicon, amorphous silica, amorphous carbon or low-K dielectric material. The forming process of the mask material layer 206 may be a chemical vapor deposition process.

In one embodiment, the material of the mask material layer 206 is the photoresist, and the through hole 207 is formed in the mask material layer 206 through exposure and development processes. When the mask material layer 206 is other materials, and the through hole 207 may be formed in the mask material layer 206 through an etching process.

The shape and the position of the through hole 207 define the shape and the position of the annular gasket subsequently formed.

Figure 3:
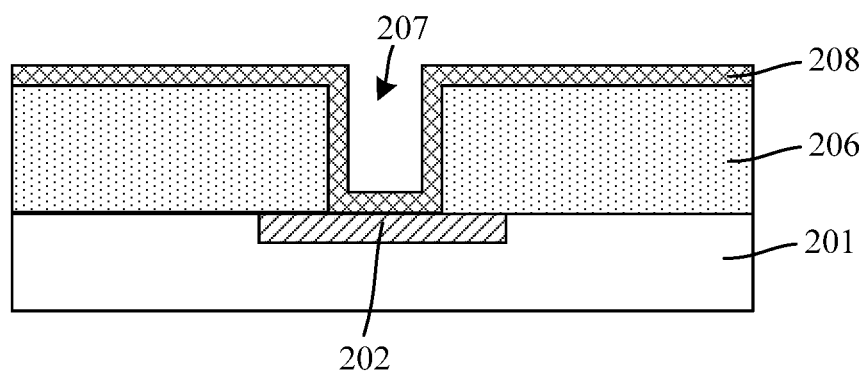

Referring to FIG. 3, the gasket material layer 208 is formed at the side wall and bottom surface of the through hole 207 and on the surface of the mask material layer 206.

The gasket material layer 208 is subsequently configured to form the annular gasket. The material of the gasket material layer 208 is different from a material of the dielectric layer subsequently formed. When subsequently forming the etching hole in the dielectric layer, the dielectric layer has higher etching selection ratio relatively to the annular gasket, so that the annular structure can effectively prevent the side etching when the through hole is formed by etching the dielectric layer, and the bottom of the etching hole is more effectively guided to the central through hole.

The material of the annular gasket material layer 208 may be one or more of silicon nitride, silicon oxide, silicon carbon nitride or silicon oxynitride. In this embodiment, the material of the annular gasket material layer 208 is silicon nitride, and the annular gasket material layer is formed using the chemical vapor deposition process.

The thickness of the gasket material layer 208 decides the width of the annular gasket subsequently formed. In one embodiment, the thickness of the gasket material layer 208 is 5 nm-5 µm.

Figure 4:
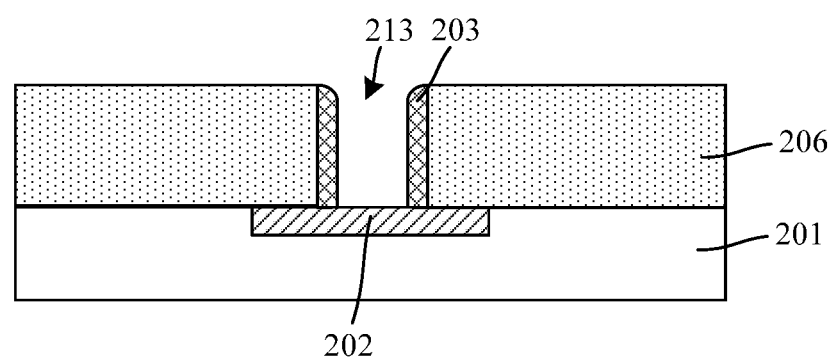

Referring to FIG. 4, the gasket material layer on the surface of the mask material layer 206 and the bottom surface of the through hole is removed by mask-free etching, so as to form the annular gasket 203 on the side wall surface of the through hole, and the central through hole 213 is formed in the center of the annular gasket 203. The size and shape of the annular gasket formed through the method have higher precision, and the annular gasket has better side wall morphology.

By forming the annular gasket 203, when the etching hole is subsequently formed in the dielectric layer, and bending or position offset occurs to the etching hole, the annular gasket can prevent side etching at the bottom of the etching hole, so that the bottom of the etching hole is guided to the central through hole of the annular gasket. Therefore, the bottom of the etching hole is correctly guided to the correct position, the formed opening structure can normally expose the surface of the target metal layer; in addition, the existence of the annular gasket can prevent the anomaly, such as electrical leakage, caused by metal diffusion brought by the contact plug subsequently formed in the opening structure.

The gasket material layer is etched using various heterogeneous dry etching processes, which may be a plasma etching process.

Figure 5:
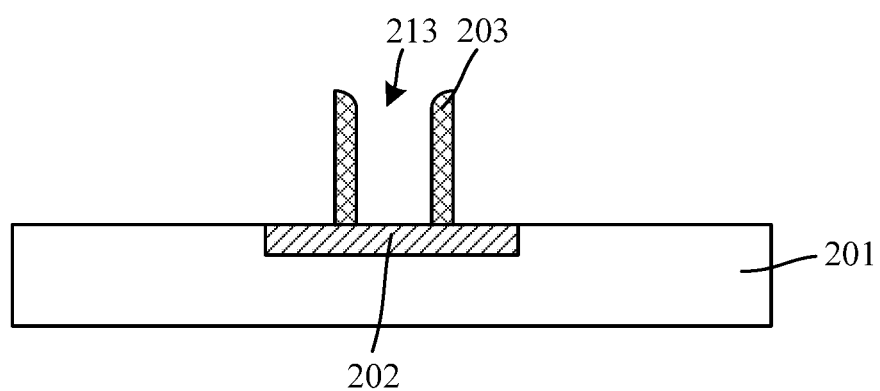

Referring to FIG. 5, the mask material layer 206 is removed after forming the annular gasket 203, and the mask material layer 206 may be removed using the wet or dry etching process.

Figure 6:
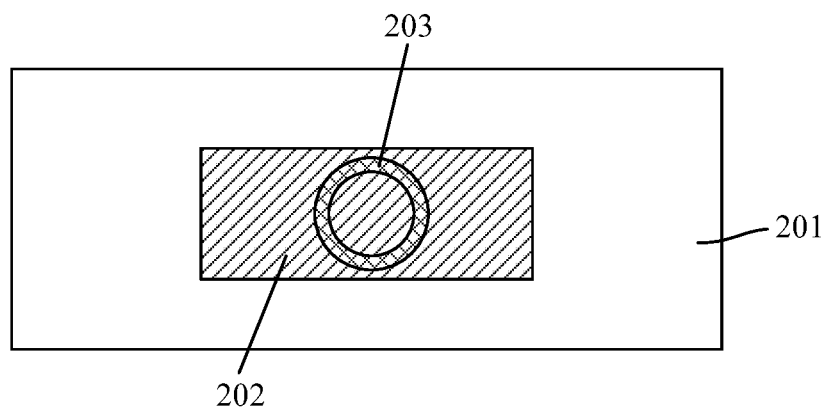
Figure 7:
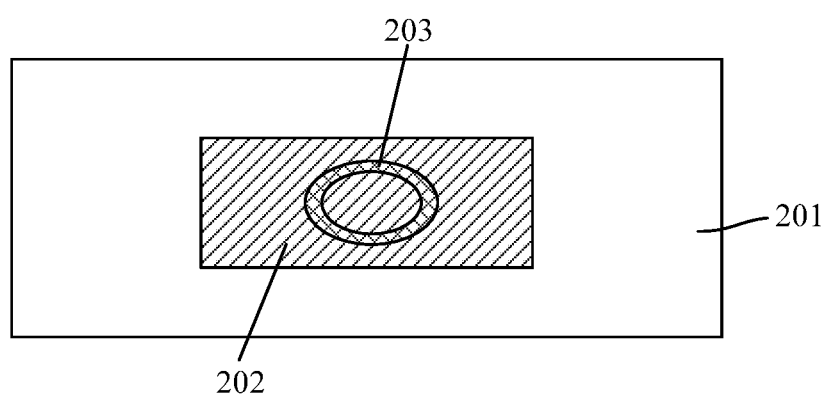

Referring to FIG. 6 and FIG. 7, which are the schematic diagrams of a look-down structure of an annular gasket 203 formed above. The shape of the annular gasket 203 shown in FIG. 6 is circular ring, and the shape of the annular gasket 203 shown in FIG. 7 is elliptical ring. In other embodiments, the shape of the annular gasket 203 may be rectangular ring. An inner diameter of the annular gasket 203 may be greater than or equal to a diameter of the etching hole subsequently formed in the dielectric layer. When the etching hole exists bending, the bottom of the etching hole is easier to be guided to the central through hole in the center of the annular gasket 203. In other embodiments, the outer diameter of the annular gasket may be less than the diameter of the etching hole subsequently formed in the dielectric layer.

Figure 8:
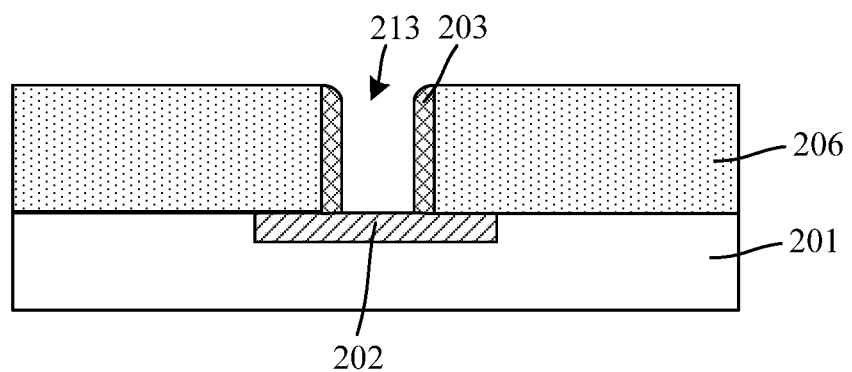

In another embodiment, referring to FIG. 8, when the mask material layer 206 is the isolation material, the mask material layer 206 may be configured to the electric isolation among devices, for example, when the mask material layer has the same material with the dielectric layer subsequently formed, before forming the annular gasket 203, the mask material layer 206 is reserved. Subsequently, the dielectric layer is directly formed on the mask material layer 206, an extra step for removing the mask material layer 206 is not required.

Figure 9:
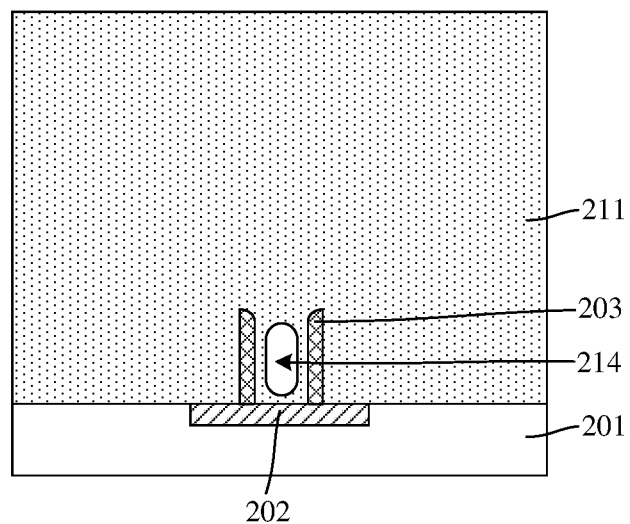

Referring to FIG. 9, the etching guide structure 214 is formed in the central through hole, and the dielectric layer 211 for covering the substrate 201, the target layer 202, the annular gasket 203 and the etching guide structure 214 is formed.

The etching guide structure 214 is formed in the central through hole in the center of the annular gasket 203. In a process of subsequently etching the dielectric layer 211 to form the etching hole, the etching rate of the etching guide structure 214 is greater than an etching rate of the dielectric layer, so the bottom of the through hole is easier to move in the direction of the etching guide structure 214, the bottom of the etching hole is guided to the central through hole, and the formed opening structure can quickly reach the target layer through the etching guide structure. The etching time of the whole formed opening structure is reduced, the complexity of the etching process of the opening structure is simplified, the etching process of the opening structure is optimized, and then the over etching to the target layer is prevented. In addition, when the problems of alignment offset and bending occur to the etching hole, since the etching rate of the etching guide structure 214 is greater than that of the dielectric layer, etching plasma gas can be accurately guided to move along the direction of the central through hole, and then the bottom of the etching hole with alignment offset and bending may be accurately and quickly guided to the central through hole through the etching guide structure so as to achieve the effect of cutoff, and the problem that the formed opening structure cannot normally expose the surface of the target layer is prevented.

In this embodiment, the etching guide structure 214 is the air gap structure, a top portion of the etching guide structure is lower than a top surface of the annular gasket, the composition of the air gap structure is air, so when the dielectric layer is subsequently etched to form the etching hole, it is easier to guide the bottom of the etching hole to the central through hole.

In one embodiment, the air gap structure is formed when the dielectric layer 211 is formed. In a specific embodiment, the forming process of the air gap structure is: when the dielectric layer is formed by a chemical vapor deposition process, a step coverage of the deposition process is regulated in such a way that the formed dielectric layer 211 seals a top opening structure of the central through hole, so as to form the air gap structure (214).

Figure 10:
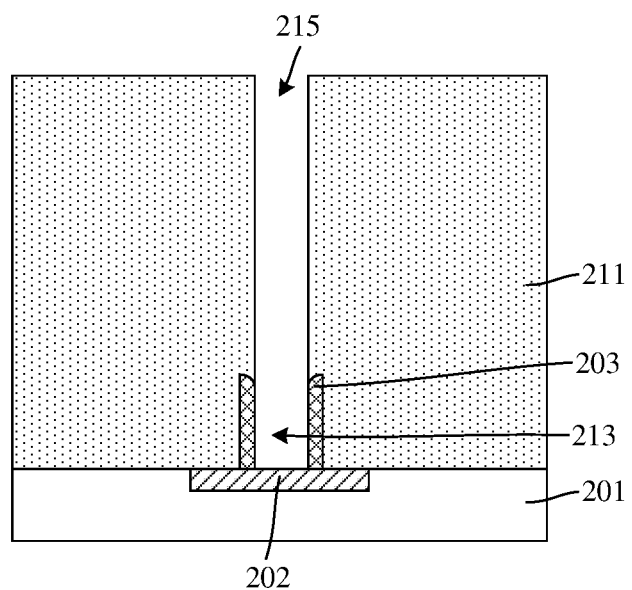

Referring to FIG. 10, the dielectric layer 211 is etched to form an etching hole 215 communicating with the central through hole 213 in the dielectric layer 211, and the etching hole 215 and the central through hole 213 form the opening structure. In a process of etching the dielectric layer 211 to form the etching hole 215, the etching guide structure 214 (referring to FIG. 9) is configured to guide the bottom of the etching hole 215 to the central through hole 213.

In a process of etching the dielectric layer 211, when the bottom of the formed etching hole 215 communicates with the air gap structure, the dielectric layer at the side wall and bottom of the central through hole 213 is removed by etching (when the air gap structure is formed, a part of the dielectric layer is formed at the side wall and bottom of the central through hole 213).

Figure 11:
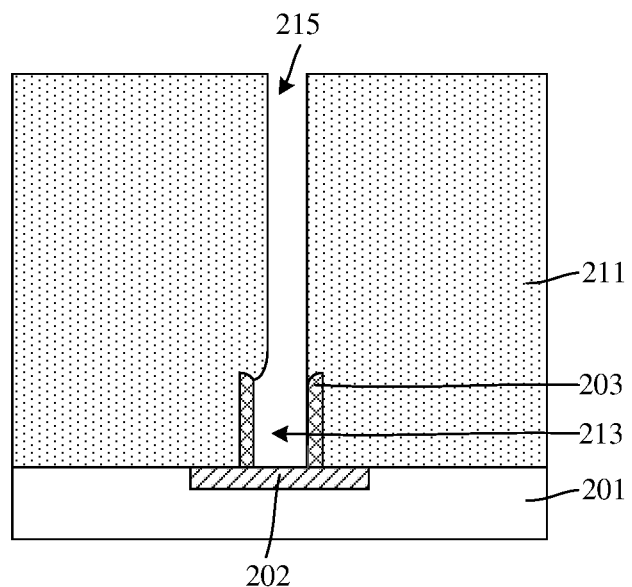

In one embodiment, when the dielectric layer 211 is etched and when the formed etching hole 215 exists bending, referring to FIG. 11, the bended etching hole 215 can be guided to be connected to the central through hole 213 through the method of the disclosure.

It needs to be noted that, in the previous embodiments, one etching hole 215 and one central through hole 213 are taken as examples for illustration. In other embodiments, multiple etching holes 215 and multiple central through holes 213 may be formed, or one etching hole communicates with one corresponding central through hole, or one etching hole communicates with multiple corresponding central through holes, or multiple etching holes communicate with one corresponding central through hole.

Figure 12:
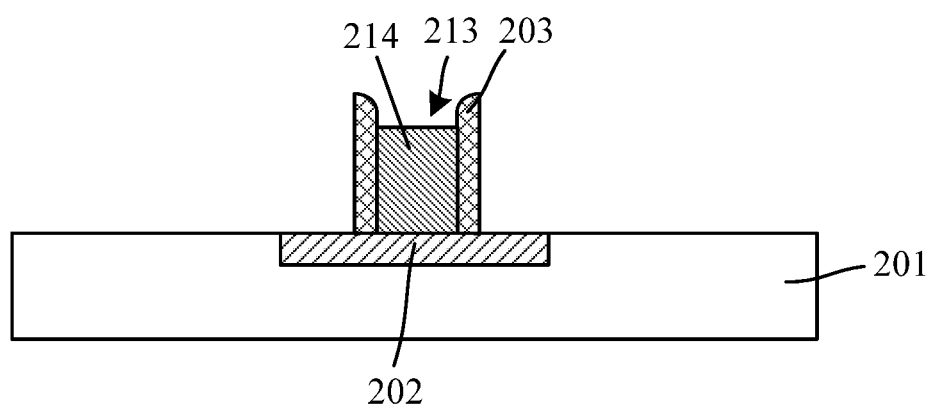

In another embodiment of the disclosure, referring to FIG. 12, the etching guide structure 214 is the sacrificial layer for filling the central through hole.

A material of the sacrificial layer is different from a material of the dielectric layer subsequently formed, and when the dielectric layer is etched to form the etching hole, the etching rate of the sacrificial layer is greater than an etching rate of the dielectric layer, so when the dielectric layer is subsequently etched to form the etching hole, it is easier to guide the bottom of the etching hole to the central through hole.

In one embodiment, the material of the sacrificial layer is one of silicon nitride, silicon oxide, carbon silicon nitride, silicon oxynitride, amorphous carbon, polyimide or ultra-low k materials.

In one embodiment, when the sacrificial layer is formed, a second air gap structure is formed in the sacrificial layer, so that the rate is higher when the etching guide structure is etched in thickness, and the etching rate and efficiency are higher when the opening is formed, which is beneficial to prevent the over etching to the target layer.

The surface of the sacrificial layer (214) may be lower than the top surface of the annular gasket 203, or is flush with the top surface of the annular gasket 203 to keep a well final morphology. If the surface of the sacrificial layer (214) is higher than the top surface of the annular gasket 203, the dielectric layer 211 outside the annular gasket 203 will be damaged, and in the next metal filling process, metal may be filled to the dielectric layer, resulting in electrical leakage.

Figure 13:
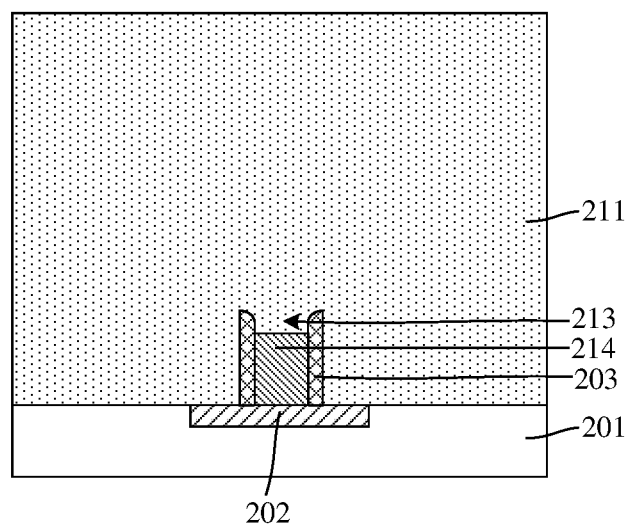

Referring to FIG. 13, the dielectric layer 211 for covering the substrate 201, the target layer 202, the annular gasket 203 and the etching guide structure (sacrificial layer) 214 is formed.

Figure 14:
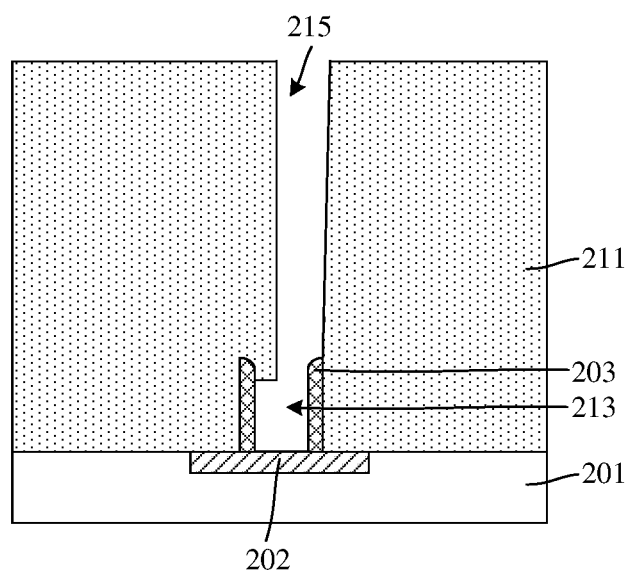

Referring to FIG. 14, the dielectric layer 211 is etched to form an etching hole 215 communicating with the central through hole 213 in the dielectric layer 211, and the etching hole 215 and the central through hole 213 form the opening structure. In a process of etching the dielectric layer 211 to form the etching hole 215, the etching guide structure (sacrificial layer) 214 is configured to guide the bottom of the etching hole 215 to the central through hole 213.

The etching hole 215 shown in FIG. 14 is the etching hole with carving offset, and the method of the disclosure can guide the etching hole 215 with carving offset to be connected to the central through hole 213. In other embodiments, the etching hole is an etching hole without carving offset.

In one embodiment, after forming the above opening structure, metal is filled in the opening structure, so as to form a contact plug.

Figure 15:
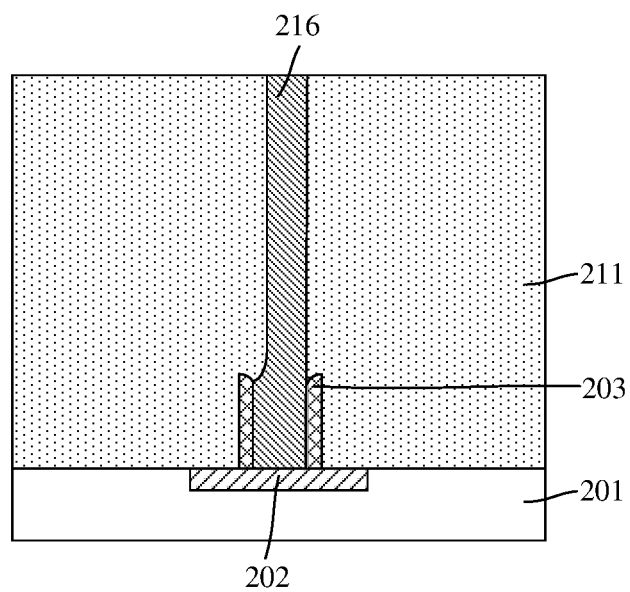
FIG. 15 is a schematic diagram of a sectional structure of a forming process for a contact plug structure according to embodiments of the disclosure.

One embodiment of the disclosure further provides a forming method for a contact plug structure, referring to FIG. 15.

The opening structure is formed using the above method, and the opening structure is used as a contact window structure.

Conductive material is formed in the contact window structure, so as to form a contact plug 216.

The conductive material may be metal or doped polycrystalline silicon.

According to the contact plug structure and the forming method thereof of the disclosure, when the etching hole is formed in the dielectric layer through the annular gasket, and bending or position offset occurs to the etching hole, the annular gasket can prevent side etching at the bottom of the etching hole, so that the bottom of the etching hole is guided to the central through hole of the annular gasket. Therefore, the bottom of the etching hole is correctly guided to a correct position, the formed opening hole can normally expose the surface of the target metal layer, and in addition, the existence of the annular gasket can prevent the anomaly, such as electrical leakage, caused by metal diffusion brought by the contact plug subsequently formed in the opening structure.

It needs to be noted that the limitation or description for the similar or same structures in this embodiment (forming method for the contact plug structure) and the previous embodiments (forming process of the opening structure) will not be defined in this embodiment, and specifically refer to the limitation or description for the corresponding part of the previous embodiments.

One embodiment of the disclosure further provides an opening structure. Referring to FIG. 10, FIG. 11 and FIG. 14, the opening structure includes a substrate 201, an annular gasket 203, a dielectric layer 211 and an etching hole 215.

A target layer 202 is formed in the substrate 201, and the substrate 201 exposes a surface of the target layer 202.

The annular gasket 203 is formed on the surface of the target layer 202, and the central through hole 213 exposing a part of the surface of the target layer 202 is provided in a center of the annular gasket 203.

The dielectric layer 211 covers the substrate 201, the target layer 202 and the annular gasket 203.

The etching hole 215 communicating with the central through hole 213 is located in the dielectric layer 211.

In one embodiment, a material of the annular gasket 203 may be different from a material of the dielectric layer 211.

In one embodiment, an inner diameter of the annular gasket 203 is greater than or equal to a diameter of the etching hole 215.

It needs to be noted that the limitation or description for the similar or same structures in this embodiment (opening structure) and the previous embodiments (forming process of the opening structure) will not be defined in this embodiment, and specifically refer to the limitation or description for the corresponding part of the previous embodiments.

One embodiment of the disclosure further provides a contact plug structure. Referring to FIG. 15, the contact plug structure includes a substrate 201, an annular gasket 203, a dielectric layer 211, an etching hole 215 and a contact plug 216.

A target layer 202 is formed in the substrate 201, and the substrate 201 exposes a surface of the target layer 202.

The annular gasket 203 is located on the surface of the target layer 202, and the central through hole 213 (referring to FIG. 11) exposing a part of the surface of the target layer 202 is provided in a center of the annular gasket 203.

The dielectric layer 211 covers the substrate 201, the target layer 202 and the annular gasket 203.

The etching hole 215 (referring to FIG. 11) communicating with the central through hole 213 is formed in the dielectric layer 211.

The contact plug 216 is located in the etching hole and the central through hole.

It needs to be noted that the limitation or description for the similar or same structures in this embodiment (the contact plug in the opening structure) and the previous embodiments (forming process of the opening structure) will not be defined in this embodiment, and specifically refer to the limitation or description for the corresponding part of the previous embodiments.

Although the disclosure has been disclosed with respect to preferred embodiments above, it is not intended to limit the disclosure. Those skilled in any art may make possible change and modification by using the above disclosed method and technical contents without deviating from the spirit and scope of the disclosure. Therefore, any simple modification, equivalent change or modification made to the above embodiments according to the technical substance of the application, which is not separated from the contents of the technical solution of the disclosure, shall fall within the protection scope of the technical solution of the disclosure.

What is claimed is:

1. A forming method for an opening structure, comprising:

providing a substrate, wherein a target layer is formed in the substrate, and the substrate exposes a surface of the target layer;

forming a mask material layer on the substrate and a part of the surface of the target layer, and forming a through hole exposing the part of the surface of the target layer in the mask material layer; forming a gasket material layer on a side wall and a bottom surface of the through hole and on a surface of the mask material layer; removing the gasket material layer on the surface of the mask material layer and the bottom surface of the through hole by mask-free etching, so as to form an annular gasket on the side wall surface of the through hole, the central through hole exposing the part of the surface of the target layer is provided in a center of the annular gasket, removing the mask material layer;

forming a dielectric layer covering the substrate, the target layer and the annular gasket; and etching the dielectric layer to form an etching hole communicating with the central through hole in the dielectric layer, the etching hole and the central through hole forming the opening structure.

2. The forming method for an opening structure of claim 1, wherein an etching guide structure is further formed in the central through hole, and when the dielectric layer is etched to form the etching hole communicating with the central through hole, an etching rate of the etching guide structure is greater than an etching rate of the dielectric layer.

3. The forming method for an opening structure of claim 2, wherein the etching guide structure is an air gap structure or a sacrificial layer filling the central through hole, and a top portion of the etching guide structure is lower than a top surface of the annular gasket.

4. The forming method for an opening structure of claim 3, wherein a forming process of the air gap structure comprises: when the dielectric layer is formed by a chemical vapor deposition process, regulating a step coverage of the deposition process in such a way that the formed dielectric layer seals an opening structure of the central through hole, so as to form the air gap structure.

5. The forming method for an opening structure of claim 3, wherein a material of the sacrificial layer is different from a material of the dielectric layer, and when the dielectric layer is etched to form the etching hole communicating with the central through hole, an etching rate of the sacrificial layer is greater than the etching rate of the dielectric layer.

6. The forming method for an opening structure of claim 1, wherein a material of the annular gasket is different from a material of the dielectric layer, and when the dielectric layer is etched to form the etching hole communicating with the central through hole, the etching rate of the dielectric layer is greater than an etching rate of the annular gasket.

7. The forming method for an opening structure of claim 1, wherein a shape of the annular gasket is circular ring, elliptical ring or rectangular ring.

8. The forming method for an opening structure of claim 1, wherein an inner diameter of the annular gasket is greater than or equal to a diameter of the etching hole.

9. The forming method for an opening structure of claim 1, wherein one etching hole communicates with one corresponding central through hole, or one etching hole communicates with a plurality of corresponding central through holes, or a plurality of etching holes communicate with one corresponding central through hole.

10. A forming method for a contact plug structure, comprising:

forming an opening structure by:

providing a substrate, wherein a target layer is formed in the substrate, and the substrate exposes a surface of the target layer;

forming a mask material layer on the substrate and the part of a surface of the target layer, and forming a through hole exposing the part of the surface of the target layer in the mask material layer; forming a gasket material layer on a side wall and a bottom surface of the through hole and on a surface of the mask material layer; removing the gasket material layer on the surface of the mask material layer and the bottom surface of the through hole by mask-free etching, so as to form an annular gasket on the side wall surface of the through hole, the central through hole exposing the part of the surface of the target layer is provided in a center of the annular gasket, removing the mask material layer;

forming a dielectric layer covering the substrate, the target layer and the annular gasket; and etching the dielectric layer to form an etching hole communicating with the central through hole in the dielectric layer, the etching hole and the central through hole forming the opening structure, wherein the opening structure is used as a contact window structure; and forming conductive material in the contact window structure, so as to form the contact plug.

11. An opening structure, formed by the method of claim 1, comprising:

the substrate, wherein the target layer is formed in the substrate, and the substrate exposes the surface of the target layer;

the annular gasket, which is located on the surface of the target layer, wherein the central through hole exposing the part of the surface of the target layer is provided in the center of the annular gasket;

the dielectric layer, which covers the substrate, the target layer and the annular gasket; and the etching hole, which communicates with the central through hole and is located in the dielectric layer, wherein the etching hole and the central through hole form the opening structure.

12. The opening structure of claim 11, wherein a material of the annular gasket is different from a material of the dielectric layer.

13. The opening structure of claim 11, wherein an inner diameter of the annular gasket is greater than or equal to a diameter of the etching hole.

14. A contact plug structure, comprising: an opening structure of claim 11; and a contact plug, which is located in the etching hole and the central through hole.

* * * * *